United States Patent [19]

Genuit

[11] Patent Number: 4,491,954

[45] **Date of Patent: * Jan. 1, 1985**

[54] ELECTRONIC SCORE-KEEPER FOR TABLE TENNIS

[76] Inventor: Luther L. Genuit, 6231 E. Calle del Paisano, Scottsdale, Ariz. 85251

[ * ] Notice: The portion of the term of this patent subsequent to Oct. 10, 1995 has been disclaimed.

[21] Appl. No.: 355,674

[22] Filed: Mar. 8, 1982

[51] Int. Cl.[3] .................... G08B 5/36; H03K 21/18

[52] U.S. Cl. .................... 377/5; 340/323 R

[58] Field of Search .................... 377/5; 340/323 R

[56] References Cited

U.S. PATENT DOCUMENTS

| | | | |
|---|---|---|---|
| 2,296,508 | 9/1942 | Eckert | 340/323 R |
| 2,455,422 | 12/1948 | Kucks | 340/323 R |
| 4,119,838 | 10/1978 | Genuit | 377/5 |

OTHER PUBLICATIONS

Miles, Dick, Sports Illustrated Table Tennis, J. B. Lippincott Co., Philadelphia, and N.Y., 1974, Time Inc., pp. 91, 92.

*Primary Examiner*—John S. Heyman
*Attorney, Agent, or Firm*—Warren F. B. Lindsley

[57] ABSTRACT

An electronic score-keeper for table tennis or Ping-Pong having a digital read-out for display of the score and having lamps which are energized to indicate responsibility for the serve. Each player presses a button at the side of the table to register his points. Proper serve indication is given throughout the course of the game, as prescribed by the international rules of table tennis.

10 Claims, 14 Drawing Figures

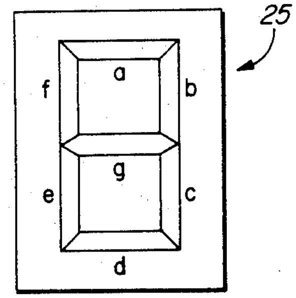
FIG. 5
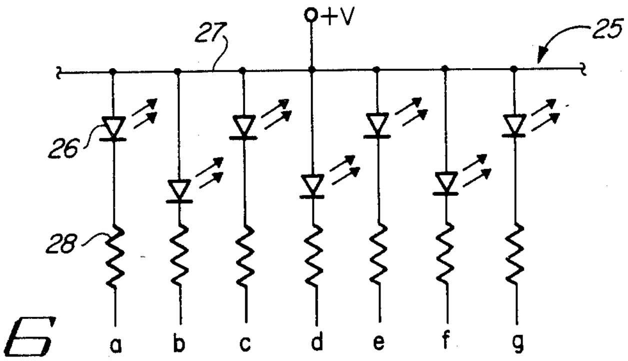
FIG. 6
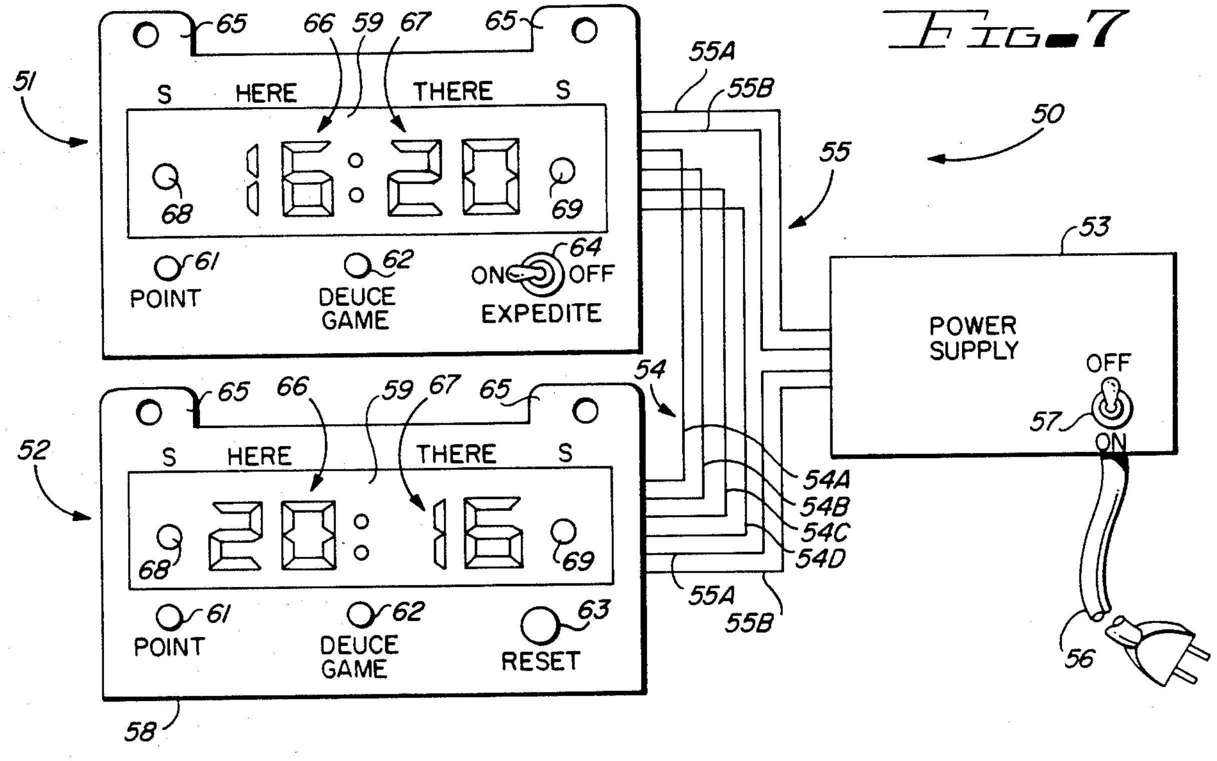
FIG. 7
BCD COUNTER
| CL | OUTPUT D C B A |
|---|---|
| 0 | L L L L |
| 1 | L L L H |
| 2 | L L H L |
| 3 | L L H H |
| 4 | L H L L |
| 5 | L H L H |
| 6 | L H H L |
| 7 | L H H H |
| 8 | H L L L |
| 9 | H L L H |
FIG. 8
BI QUINARY
| CL | OUTPUT A D C B |
|---|---|
| 0 | L L L L |
| 1 | L L L H |
| 2 | L L H L |
| 3 | L L H H |
| 4 | L H L L |
| 5 | H L L L |
| 6 | H L L H |
| 7 | H L H L |
| 8 | H L H H |
| 9 | H H L L |
FIG. 9
BCD TO SEVEN SEGMENT DECODER
| N | INPUT D C B A | OUTPUT a b c d e f g |
|---|---|---|
| 0 | L L L L | L L L L L L H |
| 1 | L L L H | H L L H H H H |
| 2 | L H H L | L L H L L H L |
| 3 | L L H H | L L L L H H L |
| 4 | L H L L | H L L H H L L |
| 5 | H L L L | L H L L H L L |
| 6 | H L L H | H H L L H L L |
| 7 | H L H L | L L L H H H H |
| 8 | H L H H | L L L L L L L |
| 9 | H H L L | L L L H H L L |
FIG. 10

ELECTRONIC SCORE-KEEPER FOR TABLE TENNIS

BACKGROUND OF THE INVENTION

There is hardly a game with more to offer as a recreational activity for people of all ages than table tennis or, as it is commonly called, Ping-Pong. The game encourages physical exercise and the development of dexterity and coordination. It is entertaining for players as well as for observers, and the playing equipment is inexpensive and widely available.

Through the 1930's, 1940's and well into the 1950's, the game was especially popular. Then, in the usual cyclical course of things, it lost popularity until the 1970's when it enjoyed such a resurgence in popularity that it was utilized as a means for encouraging friendship and cooperation among otherwise hostile countries. International tournaments were organized with teams participating from all over the world.

Unfortunately, however, the recent craze and excitement over electronic games has distracted a large body of the young people who had taken up the sport of table tennis; and these young people are now spinning dials and knobs, playing simulated table tennis and other games in which electronically produced animation is replacing the physical involvement of the original games. Much of the real recreational value is lost in the process, and the relatively high equipment costs for the electronic games are adding financial burdens for those who feel a need to be a part of the action.

One of the drawbacks of table tennis as a purely social pastime and recreational activity is the difficulty of keeping track of the score and remembering each time which player has the serve. This difficulty detracts from the enjoyment of the game and plays a part in discouraging its wider acceptance.

The goal of the present invention is to provide an electronic device for keeping track of the score and indicating the responsibility for serving, while eliminating the major barrier to the complete enjoyment of the game. The invention capitalizes on the current interest in electronics and offers a high potential for success in achieving the desired level of public acceptance for the device and the game of table tennis.

DESCRIPTION OF THE PRIOR ART

A game scoring apparatus for use in connection with the game of table tennis is described by A. F. Eckert in U.S. Pat. No. 2,296,508, issued Sept. 22, 1942. The apparatus described by Eckert indicates the individual scores for the two players up to and including maximum values of twenty-one points. In addition, a signal is provided after each group of five points to indicate that the serve is to be passed from one player to the other. The signal does not indicate which player has the serve responsiblity at any given point in the game. A "DEUCE GAME" indicator is energized when both players have reached twenty points, but the player responsible for each serve is again not identified.

A second patent, U.S. Pat. No. 2,455,422, issued to H. H. Kucks Dec. 7, 1948, describes a scoring device for table tennis which indicates the instant scores of the opposing players throughout the course of the game. The device also incorporates a serve indicator which changes state after each group of five points and identifies the player who has responsibility for the serve. The serve indicator does not provide a proper indication of the serve responsibility for the "deuce game" situation, in which the international rules prescribe that the serve shall change sides after each single point rather than after each five points as applies during the preceeding part of the game.

U.S. Pat. No. 4,119,838, issued Oct. 10, 1978 to Luther L. Genuit, author of the present invention, describes an electronic score-keeper for table tennis. This score-keeper indicates the instantaneous scores and the serving responsibility; but the operation of the serving indicator does not correspond with the international rules for table tennis. In the operation of this device, the attainment of a twenty-point score by either player initiates a "sucker's serve" system whereby the serve responsibility is assigned in an unconventional manner that is not in accordance with the official rules of the game. More specifically, the serve responsibility falls to the player who has the lower score or, in the case of a tie score, to the player who has not won the last point.

The official international rules for the game are described in a booklet entitled *Sports Illustrated Table Tennis* by Dick Miles, published by the J. B. Lippincott Company, Philadelphia and New York (Copyright 1974, Time, Inc.). On page 92 of this booklet under the chapter heading, "International Laws of Table Tennis", the rules for serving are described as follows: "After five points, the receiver shall become the server, and the server the receiver, and so on after each five points until the end of the game or the score 20-all, or if the game be interrupted under the Expedite System. From the score 20-all, or if the game be interrupted under the Expedite System, the service shall change after each point until the end of the game. The player who served first in a game shall be receiver first in the immediately subsequent game, and so on until the end of the match."

On page 91 of the same booklet, the Expedite System is defined as follows: "If a game be unfinished fifteen minutes after it has begun, the rest of that game and the remaining games of the match shall proceed under the Expedite System. Thereafter, each player shall serve one service in turn and, if the service and twelve following strokes of the server are returned by good returns of the receiver, the server shall lose the point."

It is thus seen that none of the above prior art devices correctly indicates or is capable of indicating the serve responsibility as prescribed by the international rules for table tennis under either the "deuce game" condition or under the Expedite System.

The prior art devices have also failed to provide a visual display that is both compact and readily visible to both players. The mounting of a single indicating device at one end of the net, as described in U.S. Pat. No. 4,119,838, is unsatisfactory when seven-segment displays are employed because of the distance of the device from the players and because it must be viewed from an oblique angle by the two players.

A need thus exists for a score-keeping device that provides improved functionality relative to serve indication and relative to the visibility of the visual display.

SUMMARY OF THE INVENTION

In accordance with the invention claimed, an improved electronic score-keeper is provided for registering and displaying the scores of both players and indicating which player has the serve throughout the course of the game.

It is, therefore, one object of this invention to provide an improved electronic score-keeper for Ping-Pong or table tennis.

Another object of this invention is to provide at all times a correct serve indication that is in compliance with the international rules for table tennis.

A further object of this invention is to provide at each side of the playing table a button to be depressed by the player as he gains a point, the pressing of the button causing that player's score to be advanced by one point.

A still further object of this invention is to provide one or more digital read-out displays which provide a visual indication of the immediate score.

A still further object of this invention is to provide indicating lamps which are energized to indicate which player has the serve.

A still further object of this invention is to provide an electronic score-keeper in a form which utilizes commonly available integrated circuits, thereby achieving advantages of economy and compact construction made possible by integrated circuit technology.

A still further object of this invention is to provide an improved score-keeping and serve-indicating device that may be employed for automatically implementing the Expedite System.

Yet another object of this invention is to provide an electronic score-keeper for table tennis in which improved visibility is achieved through the use of dual score and serve-indicating display panels.

Further objects and advantages of the invention will become apparent as the following description proceeds, and the features of novelty which characterize the invention will be pointed out with particularity in the claims annexed to and forming a part of this specification.

BRIEF DESCRIPTION OF THE DRAWINGS

The present invention may be more readily described by reference to the accompanying drawings in which:

FIG. 5 is a representaiton of a standard seven-segment digital read-out element which is employed in the display units employed in the invention;

FIG. 6 is a diagrammatic representation of the electronic circuit embodied in the read-out element of FIG. 5;

FIG. 7 is a perspective view of a third embodiment of the score-keeping device of the invention;

FIG. 8 is a truth table for a BCD counter which is employed as an element of the electronic circuits utilized in the implementation of the invention;

FIG. 9 is a truth table for a biquinary counter which is employed as another element of the electronic circuits utilized in the implementation of the invention;

FIG. 10 is a truth table of a BCD to seven-segment decoder-driver which is employed as still another element of the electronic circuits utilized in the implementation of the invention.

DESCRIPTION OF THE PREFERRED EMBODIMENT

Figure 1:
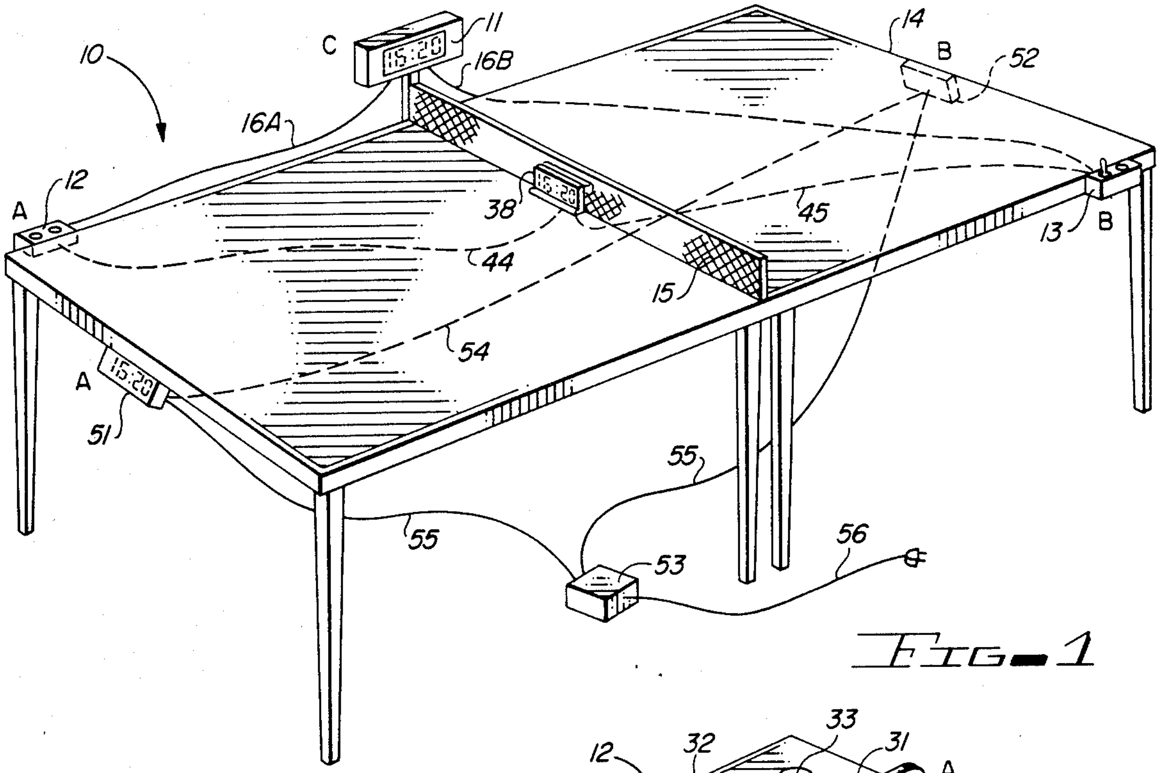
FIG. 1 is a perspective view showing the placement of alternate control and indicating elements employed in first, second and third embodiments of the invention.

Referring more particularly to the drawing by characters of reference, FIGS. 1, 2A, 3 and 4 disclose the first embodiment of the electronic score-keeper 10 of the invention comprising a display unit 11 and first and second control stations 12 and 13 mounted on a Ping-Pong table 14. In the first embodiment of the invention, the display unit 11 is mounted at one side of table 14 at the end of a net 15 where it may be viewed by either player. The first control station 12 is mounted at one side of the table near the end occupied by player A, preferably at the left side of player A as he faces the table. The second control station 13 is mounted at the side of the table near its opposite end which is occupied by player B, preferably at player B's left side as he faces the table. A first signal cable 16A connects display unit 11 to control station 12, and a second signal cable 16B connects display unit 11 to control station 13.

Figure 2A:
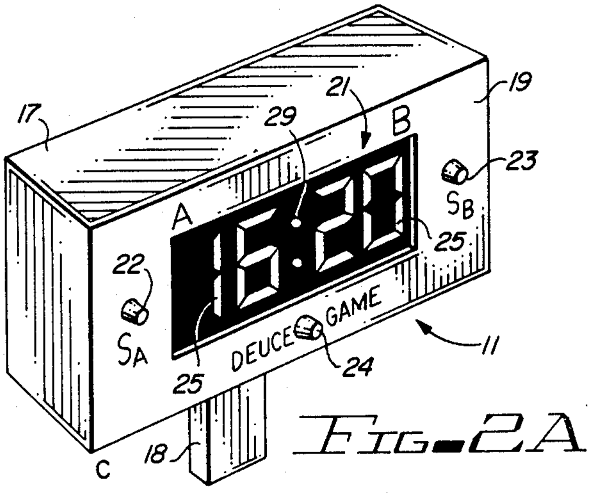
FIG. 2A is a perspective view of a display unit which serves as one element of the first embodiment of the score-keeper of the invention.

The display unit 11, as shown most clearly in FIG. 2A, comprises a housing 17 equipped with a mounting bracket 18 and carrying on its face 19 a digital readout device 21 for the display of scores, first and second serve indicator lamps 22 and 23, and a DEUCE GAME indicator lamp 24. Lamp 22 or 23 is energized to indicate that player A or player B, respectively, is entitled to serve. Lamp 24, the DEUCE GAME indicator, is energized when both players have reached scores of twenty points. When lamp 24 is energized, a rule known as the "deuce game" rule goes into effect. Under this rule, when a tie score of twenty-all occurs, the serve changes after each point is scored until the end of the game. This is in accordance with the official international rules of the game.

FIGS. 5 and 6 show the mechanical arrangement and circuit diagram, respectively, of a seven-segment numerical display device 25 employed in the read-out device 21 of unit 11. Each of the four digits of device 21, as shown in FIG. 2A, comprises a seven-segment element, as shown in FIG. 5. The seven segments, a through g, are arranged in a "FIG. 8" pattern. By selectively energizing and lighting two or more of the seven segments, any digit from zero to nine may be formed. Thus, for example, segments b and c are energized to form a "one"; segments a, b, g, e and d form a "two", etc. Electrically, each segment may be a light-emitting diode, a liquid crystal or a gas-discharge element integrally incorporated in the structure of the read-out device 21. FIG. 6 shows the electrical connection of seven lightemitting diodes 26 to form the device 25. The anodes of the seven diodes 26 are connected to a common-anode conductor 27, and a current-limiting resistor 28 is connected from the cathode of each diode to a corresponding output terminal. The seven output terminals are identified by the seven lower-case letters a through g. Ordinarily, the current-limiting resistors are not incorporated in the display device itself but are connected externally. For simplification they are here assumed to be incorporated in the display device 25.

Device 21 of FIG. 2A comprises four of the elements 25 of FIG. 5 incorporated into a single device 21. Two illuminated dots 29, arranged in the form of a colon, may optionally be provided and positioned between the first and second pairs or sets of devices 25 to set apart the scores of the two players. This arrangement is readily available at a low cost because it is commonly employed as a read-out for a digital clock.

Figure 3:
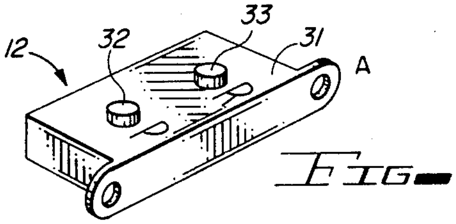
FIG. 3 is a perspective view of one of the scoring stations comprising a second element employed in the first and second embodiments of the electronic score-keeper of the invention.

The control station 12 of FIG. 3 comprises a housing 31, a first push-button switch 32 for registering the points scored by player A, and a second push-button reset switch 33 which is used to reset the counters and control circuits of the score-keeper 10 to zero at the start of each game.

Figure 4:
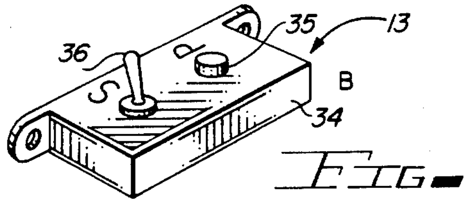
FIG. 4 is a perspective view of a second scoring station comprising a third element employed in the first and second embodiments of the electronic score-keeper of the invention.

Control station 13 of FIG. 4 is similar to station 12, having a housing 34, a push-button switch 35 for registering the points scored by player B, and a double-pole-double-throw switch 36 which may be employed to provide an optional control feature to be discussed later.

Figure 2B:
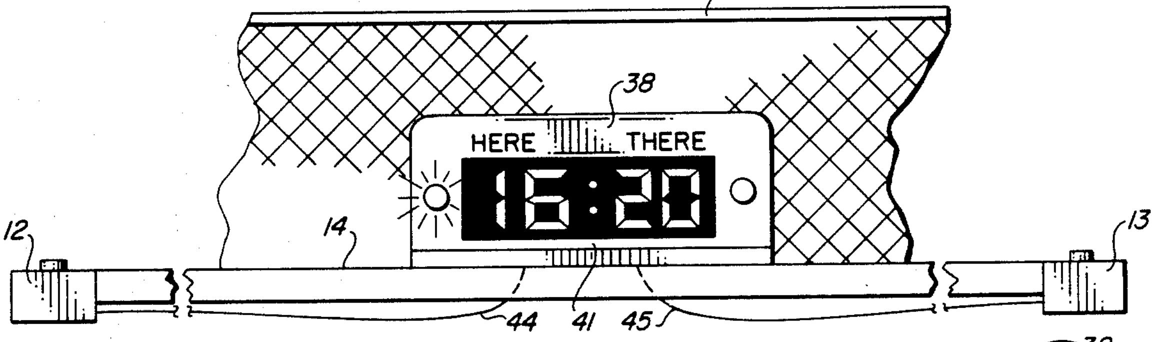
FIGS. 2B, 2C and 2D show front, end and rear views of an alternate version of the display unit of FIG. 2A, as employed in a second embodiment of the invention.
Figure 2C:
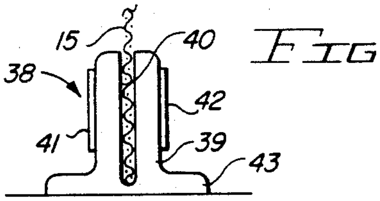
Figure 2D:
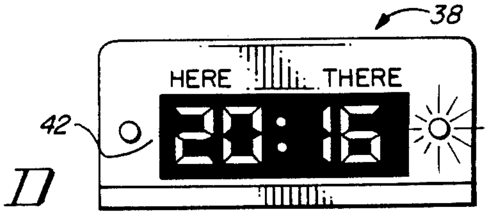

Because the single display unit 11 is somewhat difficult to read by both players when located at one end of the net 15, as shown in FIG. 1, a second embodiment of the invention utilizing a dual display device 38, as shown in FIGS. 2B, 2C and 2D, may prove to be more practical.

The housing 39 of the unit 38, as shown by the end view of FIG. 2C, is slotted lengthwise. As shown in FIG. 1 and in FIG. 2B, the unit 38 is placed at the center of the table 14 with the net 15 passing through the lengthwise slot 40. Player A, who has access to control station 12 at one end of the table 14, observes a first complete set of scoring and serve indicators 41 located on one vertical face of the unit 38, as shown in FIG. 2B; player B, who has access to control station 13 at the opposite end of table 14, observes a second complete set of scoring and serve indicators 42 located on the opposite vertical face of the unit 38, as shown in FIG. 2D. The electronic control circuits which control the energization of the two sets of indicators 41 and 42 are housed in the horizontal base 43 of the unit 38. Signal cables 44 and 45 couple the control stations 12 and 13 to the dual display device 38.

A second dual display score-keeping system 50, representing a third embodiment of the invention as shown in FIG. 7, comprises two combination control and indicator devices 51 and 52 and a power supply 53 which are interconnected by a signal cable 54 and a power cable 55.

The power supply 53 is a conventional regulated supply that receives utility power through an a-c power cord 56 and converts it to a regulated five volts d-c, as supplied to the two control and indicator devices 51 and 52 by means of the power cable 55. A power ON/OFF switch 57 is provided on the power supply 53 to energize or de-energize the devices 51 and 52. Alternatively, the power supply 53 may comprise a re-chargeable battery pack. Another alternative is to eliminate the power supply as a separate assembly and to incorporate batteries in either or both of the devices 51 and 52.

The cable 55 comprises at least two electrical conductors 55A and 55B extending to each of the two devices 51 and 52. One of the conductors, 55A, is a ground conductor, the other, 55B, is the positive five-volt conductor. Where voltages other than five volts are required in the devices 51 and 52 as might be required, for example, to energize the indicating devices incorporated therein, such other voltages may also be generated in power supply 53 and delivered over additional conductors to be incorporated in power cable 55.

The devices 51 and 52 may be essentially identical, each comprising a housing 58, a read-out indicator panel 59, and a point-scoring button 61. A reset button 63 is provided on one or both of the devices 51 and 52; an EXPEDITE switch 64 may be provided on one or the other of the two devices 51 and 52. A DEUCE GAME and/or EXPEDITE indicator 62 may be provided if desired. Indicator 62 will be energized when both players have reached twenty points and also when the Expedite clock times out if this feature is utilized. Contained within the housing 58 of each of the devices 51 and 52 is a printed circuit board on which are mounted the electronic circuit components making up the control circuits which respond to the external control switches and buttons 61, 63 and 64 to produce the appropriate scoring and serving instructions displayed on panel 59.

The housing 58 may be of plastic or other inexpensive material and is equipped with tabs or brackets 65 for attachment to the edge of the table.

The indicator panel 59 provides scoring information and serving instructions for both players. At one end of the panel 59 under the heading, "HERE", the score 66 of a first player is displayed; at the other end of the panel under the heading, "THERE", the score 67 of the second player, i.e. the opponent of the first player, is displayed. Serve indicators 68 and 69, one adjacent each of the score displays 66 and 67, are energized to show which player is to serve for the next volley. The two devices 51 and 52 are mounted at opposite ends of the table, as shown in FIG. 1. Thus, for example, device 51 would be mounted at the end of the table occupied by the first player, player A of FIG. 1; device 52 would be mounted at the end of the table occupied by the opponent, or player B of FIG. 1.

The signal cable 54 comprises first and second conductors 54A and 54B for transmission of the scoring signals from one device 51 or 52 to the other, a third conductor 54C for transmission of the reset signal, and a fourth conductor 54D for transmission of the "EXPEDITE" signal. An additional conductor or conductors will be required for implementation of a first-serve transfer switch if this feature is to be included.

The utilization of the score-keeping system 50 occurs as follows:

With the power cord 56 connected to a utility power outlet and the power switch 57 set to ON, one of the players momentarily depresses the reset button 63. This causes the score indications 66 and 67 of both devices 51 and 52 to be set to zero. One of the two serve indicators 68 and 69 on each of the devices 51 and 52 will be energized. If the indicator 69 of device 52 is energized, the indicator 68 of device 51 will be energized. The first player, who has access to device 52, observes that his opponent, who is designated by the label, "THERE", has the serve.

Figure 11:
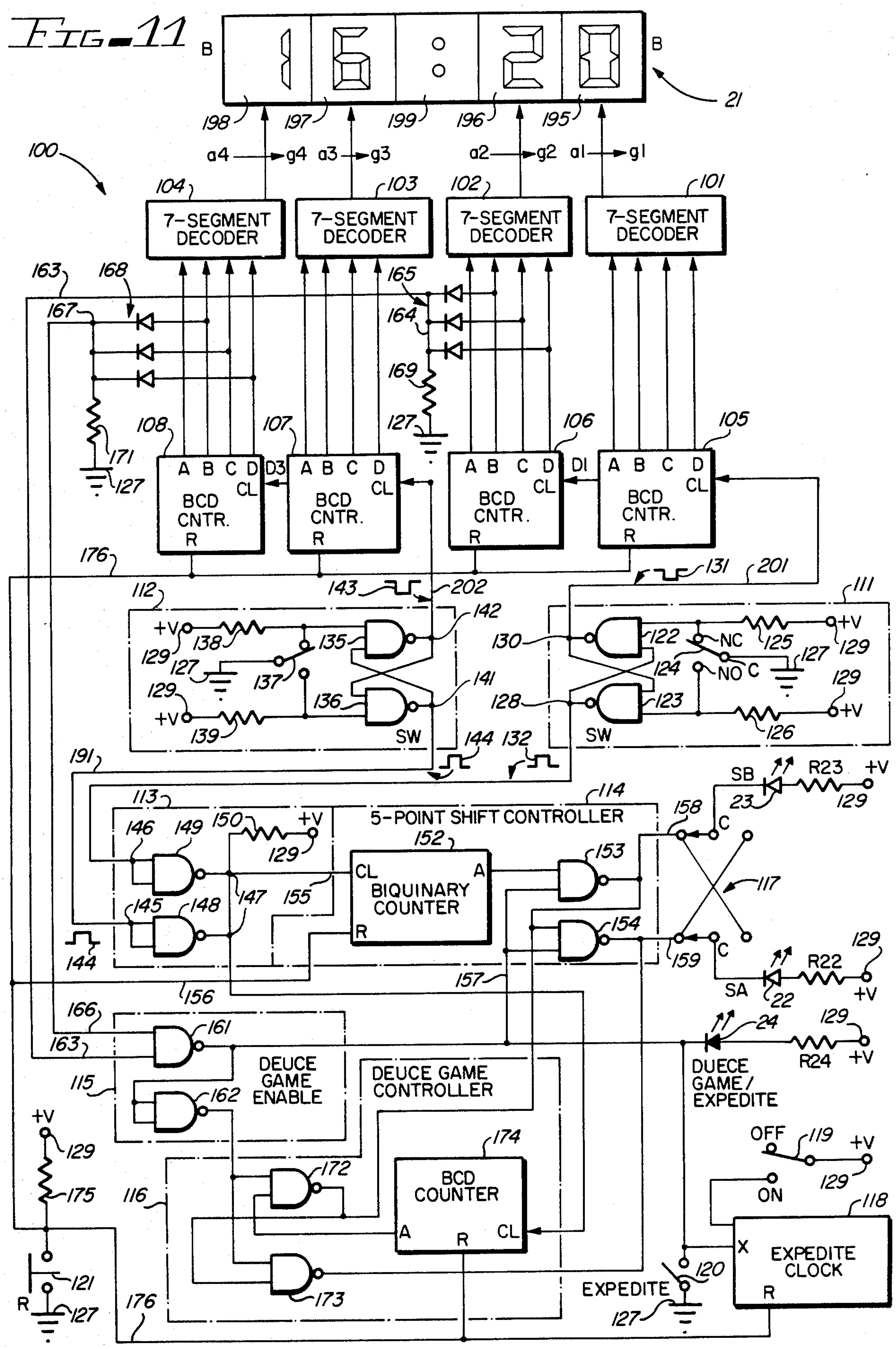
FIG. 11 is a diagram of the electronic circuit utilized in the various embodiments of the invention.

For the sake of simplicity, a first-serve transfer switch 117, as shown in FIG. 11, has not been provided in the embodiment of FIG. 7. Thus, if the players have decided that one or the other shall have the first serve, the selected player choses the appropriate end of the table. If a first-serve transfer switch is to be employed in conjunction with this embodiment of the invention, a more practical implementation may be realized through the use of a momentary push-button which may be wired to the FIVE-POINT-SHIFT controller 114 and to the DEUCE GAME controller 116, as appropriate, to permit the altering of the states of the counters 152 and 174. This approach is described in the U.S. Pat. No. 4,119,838 which was referenced in an earlier part of this specification.

If the Expedite System is to be employed, the EXPEDITE switch 64 should be set to ON prior to the execution of the reset operation just described. The reset operation will then set the Expedite clock to zero at the same time the score and serve indicators are reset.

The play now begins with the designated player executing the first serve. Each time a player scores a point, he momentarily depresses his scoring button 61, causing his score to be raised by one point, as shown on the displays 59 of both devices 51 and 52. After a total of five points has been scored by the two players, the states of the two serve indicators 68 and 69 on the two devices will be reversed, designating a change of serve. This procedure continues until one player reaches twenty-one points to win the game. In the event that both players reach scores of twenty points, the serve indicators will change state after each point is scored, in accordance with the international rules of the game. If the EXPEDITE switch has been set to ON and if the duration of the game extends beyond the fifteen-minute limit, the serve will automatically switch to the Expedite mode at the end of the fifteen minutes and will alternate after each point, again as prescribed by the rules.

The control circuit 100 of FIG. 11 is applicable in general to the first and second embodiments of FIGS. 1–4 and to the third embodiment of FIG. 7. A number of readily available integrated circuits are employed in the control circuit 100 including BCD binary counters, a biquinary counter, BCD-to-seven-segment decoders and two types of NAND logic gates.

The four-bit BCD (Binary Coded Decimal) counter has four output terminals, A, B, C and D, a clock input terminal CL and a reset terminal R. The four output terminals are utilized to indicate in binary code the value of the number stored in the counter, each output representing a power of "two" such that output A will be high or low to show a "1" or "0" in the units column; output B will be high or low (H or L) to show a "1" or "0" in the "two's" column; output C indicates a "1" or "0" in the "four's" column; and output D indicates a "1" or "0" in the "eight's" column. The counter may be set to zero by momentarily grounding the reset terminal (R). In this condition, all of the outputs A-D are low (L). The first clock pulse sets the "A" output "high", corresponding to a count of "1". The second clock pulse sets the "B" output "high" and all others "low" to show a count of "2", etc. The maximum decimal value obtainable in a four-bit binary counter is 15 with all outputs high (1+2+4+8=15). FIG. 8 shows the values or levels at output terminals A, B, C and D following successive clock pulses (CL), 0–9. Fairchild Semiconductor, Mountain View, Calif., produces a suitable BCD counter identified as a TTL/MSI 9356 4-bit Binary Counter and describes its characteristics and operation in the Fairchild Semiconductor TTL Data Book of June, 1972, on pp. 8-188 to 8-190.

The biquinary counter is a standard integrated circuit available from a number of manufacturers as a type 74196 which may be connected either as a decade (BCD) counter or as a biquinary counter. Fairchild describes its characteristics, connections and operation in its TTL Data Book referenced above on pp. 8-297 to 8-300. FIG. 9 shows a "truth table" for the biquinary connection. Output conditions are shown for the four output terminals A, B, C and D for ten clock counts (CL) from 0 to 9. It will be noted that the "A" output changes state (high or low) every five clock counts. The "A" output is employed in the monitoring circuits of the invention for keeping track of the serving responsibility.

The seven-segment decoder-driver is a commonly integrated circuit having four input terminals and seven output terminals. This decoder-driver receives binary-coded data at its four input terminals, as required to drive the corresponding segments of a seven-segment display element. Thus, for example, if the decoder-driver has its seven output terminals connected to the corresponding seven input terminals of a seven-segment display element and if it receives at its input terminals the binary-coded digit "2", which in binary notation is given as 0010, five of its seven output terminals will be grounded, the grounded output terminals energizing segments a, b, g, e and d of the display element. By reference to FIGS. 5 and 6, it may be verified that when these five terminals of the display element are grounded, a decimal digit "2" will be displayed. Seven-segment decoders of this type are available from a number of manufacturers. Fairchild Semiconductor, for example, describes on pp. 8-191 to 8-196 of its TTL Data Book (June, 1972) a decoder-driver identified as a 7447. This is the device that was employed in the first working model of the present invention. In the case of the 7447, the selected output terminals are driven to a low (L) state and are intended for use with common-anode displays, as shown in FIG. 6. In other decoder-drivers the selected outputs are driven high for use with common-cathode displays.

Two types of NAND gates are employed in the invention. The first is known as an "open-collector" type; the second incorporates a collector resistor.

The open-collector NAND gates employed in the invention are similar to the 74H01, as described in the Fairchild Data Book, pp. 5–30. The 74H01 is a TTL integrated circuit having two input terminals and an output terminal. The output level is "low" (near zero volts) when both inputs are "high" (4.0 to 5.0 volts). For all other input conditions the output is high. The output stage of the gate is an NPN transistor with its emitter connected to ground and its collector connected to the output terminal. There is no collector resistor or pull-up resistor incorporated in the device so that either a high impedance (NPN transistor turned off) or a low impedance to ground (NPN transistor turned on) is seen at the output terminal. An external pull-up resistor (not always shown in FIG. 11) or other load is ordinarily connected at the output terminal.

The second type of NAND gate which incorporates a pull-up resistor connected from the collector of the output transistor to the positive source voltage terminal is similar to Fairchild's type 74H00, as described on pp. 5–29 of the 1972 Fairchild TTL Data Book.

The control circuit 100 of FIG. 11 is employed in conjunction with the display unit 11 of FIG. 2A; the same or a similar control circuit is employed in each of the devices 51 and 52 of FIG. 7. The same control circuit 11 is also employed in conjunction with the second embodiment of FIGS. 2B–2D, but with the addition of duplicate indicators 195–198, 22, 23 and 24. Circuit 100 is mounted on a circuit board located inside housing 17 of unit 11 or inside housing 58 of devices 51 and 52. As shown in FIG. 11, control circuit 100 comprises four seven-segment decoder-drivers 101, 102, 103 and 104, four binary-coded decimal counters, 105, 106, 107 and 108, two buffered scoring switches, 111 and 112, a NOR gate 113, a FIVE-POINT SHIFT CONTROLLER 114, a DEUCE GAME ENABLE network 115, a DEUCE-GAME CONTROLLER 116, a FIRST-SERVE transfer switch 117, an EXPEDITE CLOCK 118, ON/OFF switch 119, EXPEDITE SWITCH 120 and the RESET switch 121. The circuit 100 controls the energization of the display 21 and the serve indicators 22, 23 and 24 which are also shown in FIG. 2A. The same or a similar circuit housed in each of the devices 51 and 52 of FIG. 7 controls the corresponding scoring and serving indicators of those devices.

The buffered switches 111 and 112 of circuit 100 are employed in preference to simple mechanical switches because mechanical switches tend to bounce when they are operated. When this occurs, a series or burst of pulses is generated which appear to the connected counters as several clock pulses rather than the intended single pulse. As a consequence, counting errors occur and the effectiveness of the score-keeping circuit is destroyed. The buffered switches 111 and 112 are not subject to this problem.

As shown in FIG. 11, the buffered switch 111 comprises two two-input NAND gates 122 and 123, a three-terminal, momentary-action mechanical switch 124, and two pull-up resistors 125 and 126. Switch 124 has a common terminal C, a normally closed terminal NC, and a normally open terminal NO. Its common terminal C is connected to a d-c ground terminal 127. Gate 122 has its first input terminal connected to the output terminal 128 of gate 123; its second input terminal is connected to the NC terminal of switch 124 and through resistor 125 to +5 volt source 129. Gate 123 has its first input terminal connected to output terminal 130 of gate 122; its second input terminal is connected to the NO terminal of switch 124 and through resistor 126 to source 129. NAND gates 122 and 123 are of a type 74H00 (pp. 5–29 of the 1972 Fairchild TTL Data Book) which requires no external pull-up resistor. The two NAND gates 122 and 123, connected as just described, form a flip-flop which may be set or reset by the switch 124. In the rest position of switch 124, as shown in FIG. 11, one input terminal of gate 122 is grounded through switch 124, so that the output terminal 136 of gate 122 is high and the output terminal 128 of gate 123 is low. When switch 124 is momentarily operated, contact is made between its NO terminal and the common terminal C so that an input terminal of gate 123 is grounded, causing its output terminal 128 to go high and output terminal 130 of gate 122 to go low. When switch 124 is permitted to return to its rest position, terminal 130 returns to a high condition and terminal 128 to a low condition. The momentary action of the switch 124 thus produces a negative pulse 131 at terminal 130 and a positive pulse 132 at terminal 128. The bouncing action of the switch 124 in either the NC or NO position has no effect, because the flip-flop is set or reset at the first instant of contact and remains so through any number of subsequent closures at the same contact.

Switch 112 is identical to switch 111 and is comprised of two NAND gates 135 and 136, a mechanical switch 137 and pull-up resistors 138 and 139. Interconnections are the same as those of switch 111. The operation of mechanical switch 137 produces a positive pulse 144 at output terminal 141 of gate 136 and a negative pulse 143 at output terminal 142 of gate 135.

In the practice of the invention, the mechanical switches 137 and 124 are mounted in the control units 12 and 13, respectively, of FIGS. 3 and 4 where they are identified as switches 32 and 35, or in the devices 51 and 52 of FIG. 7 where they are identified as scoring button 61.

The NOR gate 113 has two input terminals 145 and 146 and a single output terminal 147. Gate 113 comprises two open-collector NAND gates 148 and 149 and a pull-up resistor 150. The output terminals of both gates are connected to output terminal 147 and through resistor 150 to source 129. Both input terminals of gate 148 are connected to terminal 145 of gate 113; and both input terminals of gate 149 are connected to terminal 146 of gate 113. (Note: When connected in this manner, each NAND gate functions as a simple inverter, and an inverter could be substituted; but it is convenient to limit the total number of part types.) In the operation of gate 113, a positive pulse at either input terminal 145 or 146 produces a negative pulse at output terminal 147.

The FIVE-POINT-SHIFT CONTROLLER 114 comprises a biquinary counter 152 and two open-collector NAND gates 153 and 154; it has a clock input terminal 155, a reset terminal 156, a disable terminal 157 and two output terminals 158 and 159. Output terminal A of counter 152 is connected to the first input terminal of gate 153. The output terminal of gate 153 is connected to the first input terminal of gate 154 and to the first output terminal 158 of controller 114. The second input terminal of gate 153 and the second input terminal of gate 154 are connected to disable terminal 157; and the output terminal of gate 154 is connected to output terminal 159 of controller 114. Clock input terminal of controller 114 is connected to clock terminal CL of counter 152.

The FIRST-SERVE transfer switch 117, which is equivalent to switch 36 of FIG. 4, has six terminals arranged in two rows of three terminals each. Switch 117 is a conventional double-pole, double-throw switch in which the center two terminals are common. As in the typical double-pole, double-throw switch, switch 117 has two positions: In one position, contact is made between the common terminal in each row and one of the outer terminals in the same row; in the other position, contact is made in each row between the common terminal and the other outer terminal in the same row. Conversion for use as a transfer or reversing switch is accomplished by connecting the diagonally opposite outer terminals together, as shown in FIG. 11.

The serve indicators 22 and 23 are light-emitting diodes which are mounted on the front of the display unit 11, as shown in FIG. 2, or in the display units 51 and 52 of FIG. 7 where they are identified by the numerals 68 and 69. Diode 22 and serially connected resistor R22 are connected between one of the common terminals C of switch 117 and source terminal 129; while diode 23 and resistor R23 are serially connected between the other common terminal C of switch 117 and source terminal 129. The output terminals 158 and 159 of the controller 114 are connected, respectively, to first and second outer terminals on one side of switch 117. The diodes 22 and 23 are polarized to pass current flow from terminal 129 to the common terminals of the switch 117.

It will be noted that when switch 117 is in the position shown in FIG. 11, there is continuity from the diode 23 to terminal 158 of controller 114 and from diode 22 to terminal 159 of controller 114. When switch 121 is thrown to its other position, continuity is effected between diode 23 and terminal 159 through one of the diagonal switch connections and also between diode 22 and terminal 158 via the other diagonal switch connection. The switch 121 thus permits the transfer of the two SERVE indicator diodes 22 and 23 between the two output terminals of the controller 114, so that FIRST-SERVE designation may arbitrarily be assigned to player A or to player B at the start of a game. The switch 117 of FIG. 11 corresponds to the switch 36 of FIG. 4.

The DEUCE GAME ENABLE network 115 comprises two NAND gates 161 and 162. Gate 161 is an open-collector type, as defined earlier, while gate 162 has an internal pull-up resistor, a type also discussed in an earlier part of this specification. The two input terminals of gate 162 are tied together and connected to the output terminal of gate 161. The output terminal of gate 161 is connected to disable terminal 157 of controller 114. Also connected to the output terminal of gate 161 from source terminal 129 are the DEUCE GAME-/EXPEDITE indicator diode 24 and its serially-connected current-limiting resistor R24, the diode 24 being polarized to pass current from terminal 129 to gate 161. One of the two input terminals of gate 161 is connected via a conductor 163 to the output terminal 164 of a diode OR gate 165; the other input terminal of gate 161 is connected via a conductor 166 to the output terminal 167 of a diode OR gate 168.

Diode gate 165 comprises three diodes and a resistor 169. The cathodes of the three diodes are connected together at one end of resistor 169; the other end of resistor 169 is connected to ground terminal 127. The junction of the three cathodes serves as the output terminal 164 of gate 165. The anodes of the three diodes serve as three input terminals, the first of which is connected to output terminal B of counter 106, the second and third to terminals C and D, respectively, of the same counter.

Diode OR gate 168 is similarly comprised of three diodes and a resistor 171. Its three input terminals are connected, respectively, to output terminals B, C and D of counter 108.

The DEUCE GAME CONTROLLER 116 comprises two open-collector NAND gates 172 and 173 and a BCD counter 174. Counter 174 has its clock terminal CL connected to output terminal 147 of NOR gate 113 and its output terminal A connected to one input terminal of gate 172. The other input terminal of gate 172 is connected to the output terminal of gate 162 of the DEUCE GAME ENABLE network 115, and to one input terminal of gate 173. The output terminal of gate 172 is connected to the other input terminal of gate 173 and to output terminal 158 of FIVE-POINT-SHIFT CONTROLLER 114. The output terminal of gate 173 is connected to output terminal 159 of CONTROLLER 114. A simple J-K flip-flop could be substituted for counter 174.

The EXPEDITE CLOCK 118 may comprise a crystal oscillator and a series of counters arranged to count to a predetermined number in the desired fifteen-minute interval. When the predetermined number is reached, the output terminal X is clamped to a zero level (ground) where it remains until the clock is reset by means of its reset terminal R. The clock 118 is energized by means of five-volt source 129 to which it is connected via the clock ON/OFF switch 119. The manually operated EXPEDITE switch 120 is connected from output terminal X to ground terminal 127.

Reset switch 121 is a two-terminal push-button switch that closes only when depressed. One terminal of switch 121 is connected to ground terminal 127; the other terminal is connected through a resistor 175 to five-volt source 129. The junction of the ungrounded terminal of switch 121 with resistor 175 is connected to a line 176 which constitutes the RESET line. Line 176 is connected to the reset terminals R of counters 105, 106, 107 and 108, to reset terminal 156 of CONTROLLER 114, to reset terminal R of counter 174 and to reset terminal R of EXPEDITE CLOCK 118.

The output terminal 128 of gate 123 of switch 111 is connected to input terminal 146 of NOR gate 113; and the output terminal 141 of gate 136 of switch 112 is connected to input terminal 145 of NOR gate 113. The output terminal 147 of gate 113 is connected to input terminal 155 of FIVE-POINT-SHIFT CONTROLLER 114, terminal 155 being connected to the clock terminal CL of counter 152.

The display 21 comprises four seven-segment digital display elements 195, 196, 197 and 198 arranged in two pairs separated by a colon 199. The first pair of elements comprising elements 195 and 196 display the score of player B, and the second pair of elemerts 197 and 198 display the score of player A. In the preferred embodiment, the colon is implemented by means of lightemitting diodes which are always energized to set the two scores apart for better distinction therebetween. Each of the elements 195–198 has seven control terminals a–g which are grounded to energize selectively the corresponding elements a–g, as shown in FIGS. 5 and 6. It is assumed that individual current-limiting resistors are internally mounted, as discussed earlier and as shown in FIG. 6.

The seven output terminals a–g of the decoderdrivers 101, 102, 103 and 104 are connected, respectively, to the corresponding control terminals a–g of the display elements 195, 196, 197 and 198; so that decoder 101 controls element 195, decoder 102 controls element 196, decoder 103 controls element 197, and decoder 104 controls element 198.

The four output terminals A–D of counter 105 are connected to the corresponding input terminals of decoder-driver 101; output terminals A–D of counter 106 are connected to the corresponding input terminals of decoder-driver102; output terminals A–D of counter 107 are connected to the corresponding input terminals of decoder-driver 103; and the output terminals A–D of counter 108 are connected to the corresponding input terminals of decoder-driver 104. Output terminal D1 of counter 105 is also connected to clock terminal CL of counter 106; and output terminal D3 of counter 107 is also connected to clock terminal CL of counter 108. The clock terminal CL of counter 105 is connected by a conductor 201 to the output terminal 130 of gate 122 of switch 111; and the clock terminal CL of counter 107 is connected by a conductor 202 to the output terminal 142 of gate 135 of switch 112. The RESET line 176 from RESET switch 121 is connected to the RESET terminals R of counters 105–103 and, as indicated earlier, to terminal 159 of CONTROLLER 114, to RESET terminal R of controller 116 and to RESET terminal R of clock 118.

The score-keeping function of the circuit 100 involves only the buffered switches 111 and 112, the RESET switch 121, the counters 105–108, the decoder-drivers 101–104 and the display 21. At the start of a game, the normally open RESET switch 121 is momentarily closed to reset the counters 105–108 to zero by grounding the common RESET line 176. As the game progresses, each player registers his own points as he makes them by depressing switch 124 or 137. As explained earlier, the momentary action of the switch 124 or 137 produces at output terminal 130 or 142 a negative pulse 131 or 143 which is delivered to the clock terminal CL of counter 105 or 107 by conductor 201 or 202, respectively. Each of the counters 105 and 107 is advanced one count by each successive pulse 131 or 143 received at its clock terminal until reaching a count of nine. On the tenth pulse received, counter 105 or 107 is reset to zero; and the connected counter 106 or 108 is advanced to a count of "one" which remains until the associated counter 105 or 107 has registered an additional ten counts. The sevensegment decoders 101–104 respond to the data stored in the counters 105–108, causing the running score to be displayed by the readout device 21.

Meanwhile, counter 152 of the FIVE-POINT SHIFT CONTROLLER 114 receives the pulse from gate 113 at its clock terminal CL each time player A or player B scores a point. During the scoring of the first five points, the output terminal A of counter 152 is low, output terminal 158 is high and terminal 159 is low. Assuming switch 117 is in the position shown in FIG. 11, SERVE indicator 22 is thus energized and SERVE indicator 23 is de-energized during the first five points made. Upon the scoring of the fifth point, terminal A switches to a high state, terminal 158 switches to a low state and terminal 159 to a high state; whereupon indicator 23 is energized and indicator 22 is de-energized. At each multiple of five points scored, the states of the indicators 22 and 23 are reversed in this manner to indicate that player A or player B is to serve.

The above described mode of operation of the SERVE indicators continues under the control of FIVE-POINT-SHIFT CONTROLLER 114 until both players A and B have each scored twenty points. When the score of player A reaches twenty points, output terminal B of counter 108 switches from a low (L) to a high (H) state. The high state at terminal B produces a high level at the output terminal 167 of diode gate 168 and, hence, at one input terminal of gate 161 of DEUCE GAME ENABLE network 115. The output of gate 161 remains high at this point because only one input is high. Now if player B reaches a score of twenty points, output terminal B of counter 106 switches to a high state, causing the output terminal 164 of diode gate 165 to go high. The high level from gate 165 is transmitted via line 163 to the other input terminal of gate 161. Both input terminals of gate 161 are now high. The output terminal of gate 161 thus switches to a low state with the result that the connected disable terminal 157 of CONTROLLER 114 is switched to a low state, energizing DEUCE GAME indicator lamp 24. The output terminals of both gates 153 and 154 of CONTROLLER 114 respond to the low signal at terminal 157 by going high, and CONTROLLER 114 is thus effectively disabled.

At the same time, the low output level at the output terminal of gate 161 is inverted to a high level at the output of gate 162, the high level enabling gates 172 and 173 of DEUCE GAME CONTROLLER 116. BCD counter 174 of controller 116, which receives a clock signal from NOR gate 113 each time player A or B scores a point, changes state at its output terminal A each time a point is scored. This change of state at each scoring causes gate 172 to change state as each point is scored. Gate 173, having one input terminal held high by gate 162, responds to the output signal received at its other input terminal from gate 172 and produces at its output terminal a signal that is high when the output of gate 172 is low, and vice versa. The output of gate 172, being connected to the cathode of one indicator lamp 23, energizes lamp 23 on alternating counts; while gate 173, being connected to the cathode of lamp 22, energizes lamp 22 on the counts for which lamp 23 is not energized. It will be noted from an examination of the truth tables of FIGS. 8 and 9 for counters 174 and 152, respectively, that terminals A of both counters switch from high (H) to low (L) each time the count reaches ten, twnety, thirty, forty, etc. At a combined count of thirty-nine for the two players, the output terminals A of both counters are high. The output terminal of gate 153 is thus low and lamp 23 is energized, assuming switch 117 is in the state shown in FIG. 11. At the combined count of forty (both players at twenty points), a change of serve is called for by the rules of the game. The desired change of serve will be called for by virtue of the fact that at the occurrence of the fortieth point, when CONTROLLER 114 is disabled and controller 116 is enabled, the output terminal A of counter 174 switches to a low state causing the output of gate 172 to go high and the output of gate 173 to go low. Lamp 23 is thus extinguished and lamp 22 is energized to instruct the proper change of serve.

Further examination of the truth table of FIG. 8, which also applies to counters 105–108, reveals that at least one of the output terminals B, C and D of each of the counters 106 and 108 will be high for scores in excess of twenty points until the capacity of the scoring register (ninety-nine points) is exceeded. The significance of this is that controller 114 will remain disabled and controller 116 will remain enabled and in control of the serve indicators so that, for all practical purposes, the proper serve indications will be provided with alternation after each point until the end of the game.

The FIVE-POINT-SHIFT CONTROLLER 114, the DEUCE GAME CONTROLLER 116 and the DEUCE GAME ENABLE network 115 thus together comprise a dual mode serve controller which is operative in a five-point-shift mode for the initial portion of the game until a score of twenty-all is achieved, and thereafter is operative in a one-point-shift mode until the end of the game, in accordance with the official rules of table tennis.

As discussed earler, alternation of the serve with each point served is also prescribed under the Expedite system upon the expiration of fifteen minutes' playing time. If the switch 119 has been closed prior to the start of the game, the clock 118 will be set to zero when the reset button 121 is operated at the start of play. If play is still under way after fifteen minutes, output terminal X of clock 118 will switch from high to low, energizing lamp 24 indicating, in this case, that the EXPEDITE serve procedure is in effect. At the same time, by virtue of the connection of terminal X to the output terminal of gate 161, FIVE-POINT-SHIFT CONTROLLER 114 is disabled and DEUCE GAME CONTROLLER 116 is enabled, as in the case of a DEUCE GAME condition. The serve is thus again alternated with each point, as prescribed by the rules of the game.

In the case of the dual display score-keeping system 50 of FIG. 7, each of the devices 51 and 52 may incorporate a substantially complete control circuit 100. A common reset line will reset all counters simultaneously in both devices. Scoring signals from both players are received and responded to in each device. Thus, for example, a point scored by the player controlling device 51 will increment the counters controlling the score 66 displayed under the heading "HERE"; while the same scoring signal transmitted over the signal cable 54 to device 52 will increment the counters controlling the score 67 displayed under the heading "THERE" of device 52. Duplication of the scoring counters, serve controllers and even the EXPEDITE clock is feasible from the standpoint of cost; because the entire control circuit 100, with the exception of the indicators and mechanical switches, may be implemented as a single-chip integrated circuit package which may be manufactured in quantity at low cost. The complexity of the circuit is considerably less that that involved in the currently popular calculators which are readily available for a few dollars each.

In the case of the dual display unit 38 of FIGS. 2B, 2C and 2D, only the display indicators and associated current-limiting resistors need be duplicated. Common decoder-drivers 101–104 and a common serve controller located in the base 43 may be employed to drive the two sets of scoring and serve indicators 41 and 42. The total material cost for the arrangement of FIGS. 2B–2D may thus be somewhat lower than the material cost for the arrangement of FIG. 7, in which the complete control circuit 100 is duplicated.

In the cases of the second and third embodiments, the display panels are quite obviously more readily visible and distinguishable for players at both ends of the table. Smaller and less expensive indicating devices may be employed while still retaining the improved visibility. Such improved visibility is the direct result of the provision of duplicate display panels, each of the two display panels being dedicated to the use of one of the two opposing players, and each oriented at a right angle to the line of vision of the associated player.

It will be recognized that various circuit means other than those described may be employed to implement the different functional characteristics of the control circuit 100. The serve controller, including the FIVE-POINT-SHIFT CONTROLLER 114, the DEUCE GAME ENABLE circuit 115 and the DEUCE GAME CONTROLLER 116, may readily be replaced, for example, by a microprocessor which can be programmed to control the serve indicators, in accordance with the official rules of the game.

A practical and effective scoring device is thus provided, in accordance with the stated objects of the invention; and, although but a few embodiments of the invention have been illustrated and described, it will be apparent to those skilled in the art that various changes and modifications may be made therein without departing from the spirit of the invention or the scope of the appended claims.

What is claimed is:

1. An electronic score-keeper for table tennis comprising:

first and second scoring switches, first and second sets of numerical display devices, first and second serve indicators, an electronic control circuit comprising first and second electronic counters and a dual mode serve controller, reset means, means for coupling said dual mode serve controller to said first and second scoring switches, to said first and second electronic counters and to said first and second serve indicators, means for coupling said first electronic counter to said first scoring switch and to said first set of numerical display devices, means for coupling said second electronic counter to said second scoring switch and to said second set of numerical display devices, said first electronic counter being responsive to the actuation of said first scoring switch and said second electronic counter being responsive to the actuation of said second scoring switch, said dual mode serve controller responding to the actuation of either of said first and second scoring switches and to the status of said first and second electronic counters by appropriately controlling the energization of said first and second serve indicators, said dual mode serve controller being operative in a five-point-shift mode until a score of twenty-all is achieved and thereafter being operative in a one-point-shift mode until the conclusion of the game, and said reset means being coupled to said first and said second electronic counters and to said serve controller, whereby when said first or second scoring switch is actuated by the associated player each time a point is gained, the associated said sets of numerical display devices register the running scores of both players, said first and said second serve indicators are alternately energized as appropriate to identify which of said players has the responsibility for the serve in accordance with the current official rules of table tennis, and at the conclusion of the game, when said reset means is actuated by one of the players, said first and said second counters and said serve controller are reset to zero for the start of another game.

2. The electronic score-keeper set forth in claim 1 in further combination with:

a first-serve transfer switch coupled to said serve controller, said first-serve transfer switch being actuated manually by one of said players at the start of a game to effect the transfer of the first-serve indication from one of said first and second serve indicators to the other.

3. The electronic score-keeper set forth in claim 1 in further combination with:

a deuce game indicator coupled to said dual mode serve controller, said deuce game indicator being energized upon the occurrence of a score of twenty-all and remaining energized thereafter until the end of the game.

4. The electronic score-keeper set forth in claim 1 in further combination with:

an expedite clock, and an expedite game indicator, said expedite clock being coupled to said dual mode serve controller, to said expedite game indicator, and to said reset means, whereby said expedite clock is set to zero by the actuation of said reset means at the start of the game, said expedite clock then timing the duration of play to the end of a fifteen minute period at which time said expedite clock causes said expedite game indicator to be energized and causes said dual mode serve controller to become operative in its said one-point-shift mode for the remainder of the game.

5. The electronic score-keeper set forth in claim 1 wherein:

said dual mode serve controller comprises a five-point-shift controller, a deuce game controller, and a deuce game enable network, said deuce game enable network being coupled to said first and second electronic counters, to said five-point-shift controller, and to said deuce game controller, said first and second serve indicators being coupled to said five-point-shift controller and to said deuce game controller, said deuce game enable network being responsive to the status of said first and second electronic counters, said five-point-shift controller and said deuce game controller being responsive to said first and second scoring switches and to said deuce game enable network, and said first and second serve indicators being alternately energized either by said five-point-shift controller or by said deuce game enable network, whereby said deuce game enable network causes said five-point-shift controller to exercise control of said first and second serve indicators during the first operating mode of said dual mode serve controller, causes said deuce game controller to exercise control of said first and second serve indicators during the second operating mode of said dual mode serve controller, and effects the transition from said first to said second operating mode upon the detection of a twenty-all score as registered in said first and second electronic counters.

6. An electronic score-keeper for table tennis comprising:

first and second scoring switches for actuation, respectively, by opposing first and second players, first and second display panels, control circuit means for control of said first and second display panels, reset means, means for coupling said first and second scoring switches to said control circuit means, means for coupling said reset means to said control circuit means, means for coupling said control circuit means to said first and second display panels, each of said first and second display panels incorporating first and second sets of numerical display devices for the indication of the accumulated points of each of said first and second players, each of said first and second display panels incorporating serve indicator means for identification of the player having responsibility for the next serve, said control circuit means being responsive to said first and second scoring switches and to said reset means, said first and second sets of numerical display devices and said serve indicator means of each of said first and second display panels being responsive to control signals from said control circuit means, said first and second display panels being adapted to be mounted on the table in orientation relative to the playing positions of said first and second players such that the viewing plane of said first display panel may be approximately perpendicular to the line of sight of said first player and the viewing plane of said second display panel may be approximately perpendicular to the line of sight of said second player, said control circuit means incorporating a dual mode serve controller, said dual mode serve controller being operative in a five-point-shift mode until a score of twenty-all is achieved and thereafter being operative in a one-point-shift mode until the conclusion of the game, whereby when said first or second scoring switch is actuated by the assoiated player each time he gains a point, the associated said first and second sets of numerical display devices of said first and second display panels register the running score and said serve indicator means of said first and second display panels are alternately energized as appropriate throughout the full course of the game to identify, in accordance with the current official international rules for the game of table tennis, which of said players has the responsibility for the next serve, and at the conclusion of the game, when said reset means is actuated by one of said first and second players, said first and second sets of numerical display devices and said serve indicator means of said first and second display panels are reset to zero for the start of another game.

7. The electronic score-keeper of claim 6 wherein:

said control circuit means comprises first and second electronic control circuits, each of said first and second electronic control circuits comprising first and second electronic counters and a serve controller, each of said first and said second electronic control circuits being coupled to said first and second scoring switches and to said reset means, said first electronic control circuit being coupled to said first display panel, and said second electronic control circuit being coupled to said second display panel.

8. The electronic score-keeper of claim 7 wherein:

said first scoring switch, said first display panel and said first electronic control circuit are incorporated in a first control and indicating device, and said second scoring switch, said second display panel and said second electronic control circuit are incorporated in a second control and indicating device, said first control and indicating device being adapted for mounting to the edge of the playing table at one end near said first player, said second control and indicating device being adapted for mounting to the edge of the table at the opposite end near said second player, wherein said first player is afforded convenient access for control and perpendicular viewing of said first control and indicating device and said second player is afforded convenient access for control and perpendicular viewing of said second control and indicating device, each control and indicating device displaying the accumulated points of each of said first and second players and each identifying the player responsible for the next serve.

9. The electronic score-keeper of claim 6 wherein:

said first and second display panels and said control circuit means are incorporated in a single housing adapted to be mounted at the center of the table under the net, said housing incorporating a slot through which the net may be passed, said first display panel facing said first player, said second display panel facing said second player, said first scoring switch being adapted for mounting at one end of said table for convenient access by said first player, and said second scoring switch being adapted for mounting at the opposite end of said table for convenient access by said second player, whereby the viewing plane of said first display panel is oriented approximately perpendicular to the line of sight of said first player and the viewing plane of said second display panel is oriented approximately perpendicular to the line of sight of said second player.

10. The electronic score-keeper of claim 6 wherein:

said control circuit means incorporates an expedite clock, each of said first and second display panels incorporates an expedite game indicator, said expedite clock being coupled to said dual mode serve controller, to said expedite game indicator, and to said reset means, whereby said expedite clock is set to zero by the actuation of said reset means at the start of the game, said expedite clock then timing the duration of play to the end of a fifteen-minute period, at which time said expedite clock causes said expedite game indicator to be energized and causes said dual mode serve controller to become operative in its said one-point-shift mode for the remainder of the game.

* * * * *